United States Patent [19]

Foreman

[11] 4,034,240

[45] July 5, 1977

[54] SINE-TO-SQUARE WAVE CONVERTER

[75] Inventor: Donald S. Foreman, Fridley, Minn.

[73] Assignee: Honeywell Inc., Minneapolis, Minn.

[22] Filed: Dec. 29, 1975

[21] Appl. No.: 645,068

[52] U.S. Cl. .......................... 307/252 F; 307/261; 307/301

[51] Int. Cl.² .................................. H03K 17/00

[58] Field of Search ........ 307/252 F, 252 UA, 261, 307/301; 328/13, 27

[56] References Cited

UNITED STATES PATENTS

| | | | |
|---|---|---|---|
| 3,439,237 | 4/1969 | Sylvan | 307/252 F |
| 3,564,296 | 2/1971 | Lum | 307/261 |
| 3,705,990 | 12/1972 | Pileckis | 307/252 F |
| 3,712,991 | 1/1973 | Albright | 307/252 F |
| 3,772,529 | 11/1973 | Boeing | 307/252 F |

OTHER PUBLICATIONS

G.E. Appln. nte. 90.70 11/67 Semiconductor Prod. Dept. the D13T aput by Spofford, Jr.

*Primary Examiner*—Stanley D. Miller, Jr.
*Assistant Examiner*—B. P. Davis
*Attorney, Agent, or Firm*—Charles J. Ungemach

[57] ABSTRACT

A sine-to-square wave converter circuit utilizes a programmable unijunction transistor (PUT).

10 Claims, 2 Drawing Figures

SINE-TO-SQUARE WAVE CONVERTER

BACKGROUND OF THE INVENTION

The present invention relates to an electronic circuit for producing square wave signals. In particular, the present invention is a sine-to-square wave converter circuit which derives a square wave pulse waveform from a sinusoidal alternating current (AC) waveform.

In many electrical systems, there is a need for clock pulses to provide timing and synchronization of the system. In many systems, such as traffic controllers, these clock pulses may be derived from a 60 cycle AC waveform. The input waveform must be converted from a sinusoidal waveform to a square edge pulse waveform in order to operate the logic circuits of the controller.

One commonly used technique for converting from sine to square waves is to apply the AC sinusoidal waveform to a CMOS inverter. This technique, however, has some shortcomings. First, the CMOS inverter has relatively low hysteresis and, therefore, relatively low noise immunity. Second, momentary spikes of several hundred volts on the AC waveform can destroy a CMOS inverter. An elaborate input protection network is often required to protect the CMOS device from these voltage spikes.

SUMMARY OF THE INVENTION

The present invention is a sine-to-square wave converter circuit which overcomes the shortcomings of the prior art circuits. The present invention includes programmable unijunction transistor means (PUT) having a gate, an anode, and a cathode. An AC signal is applied to the anode of the PUT through a first impedance means and a reference voltage is applied to the gate of the PUT through a second impedance means. Capacitor means connected between the anode and cathode, together with the first impedance means, provides filtering of voltage spikes on the AC signal. The square wave output signal is derived from the gate of the PUT.

DETAILED DESCRIPTION OF THE PREFERRED EMBODIMENT

Figure 1:
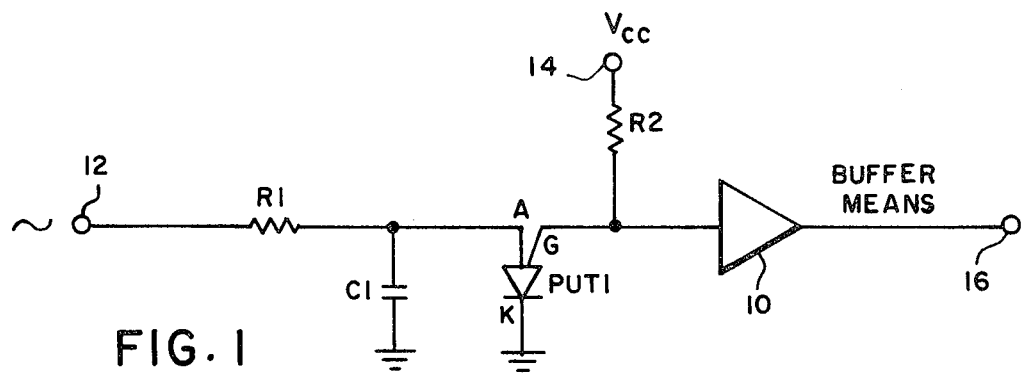
FIG. 1 schematically shows the sine-to-square wave converter circuit of the present invention.

FIG. 1 shows the sine-to-square wave converter circuit of the present invention. This circuit includes a programmable unijunction transistor PUT1 having an anode A, gate G, and cathode K, resistors R1 and R2, capacitor C1, and buffer means 10. An AC signal is applied to terminal 12, and a reference voltage Vcc is applied to terminal 14. The square wave output signal appears at output terminal 16.

Resistor R1 is connected between terminal 12 and the anode to limit the maximum currents to the anode of PUT1. Capacitor C1 is connected between the anode and the cathode. Resistor R1 and capacitor C1 together form an RC filter circuit which filters out voltage spikes on the AC waveform. The time constant of the RC circuit formed by R1 and C1 is sufficient to provide filtering of the voltage spikes without causing significant phase shift of the input AC waveform.

Resistor R2 is connected between terminal 14 and the gate G. The reference voltage Vcc applied to terminal 14 is selected so that the peak amplitude of the AC waveform is not less than 1.5 times Vcc.

Buffer means 10 is connected between the gate G and output terminal 16. Buffer means 10 is any circuit which will transform the squared output voltage waveform at the gate G into a form suitable for use by the particular logic circuits which use clock pulses from output terminal 16. With proper selection of Vcc, it is sometimes possible to omit buffer means 10, particularly when the logic circuits are CMOS devices. In the case of TTL logic circuits, buffer means 10 is required and may be a CMOS inverter, a comparator, a Schmitt trigger, or any other suitable means for driving TTL logic circuits.

Programmable unijunction transistor PUT1 has the following properties. As long as the anode voltage is held lower than the gate voltage, but still positive with respect to the cathode, the anode current is very small. When the anode voltage exceeds the gate voltage by a small threshold level, typically 0.7 volts, PUT1 "fires". PUT1 then conducts as much anode current as is necessary to reduce the anode voltage to about 1 volt above the cathode voltage. It is necessary, therefore, that the current be limited by suitable current limiting means so that the current to the anode does not exceed a level which would destroy PUT1. When PUT1 "fires", the gate current also abruptly increases from a few microamperes to several milliamperes.

When PUT1 has fired, it will remain in conduction until the anode current drops below a "holding current" value which is typically about 50 microamperes. At that point, PUT1 drops out of conduction. The anode voltage may then jump to a value between zero and the gate voltage.

If the anode of PUT1 goes negative with respect to the cathode, PUT1 does not conduct as long as the negative voltage does not exceed device ratings. This negative voltage rating is typically about 30 volts with respect to the cathode.

Figure 2:
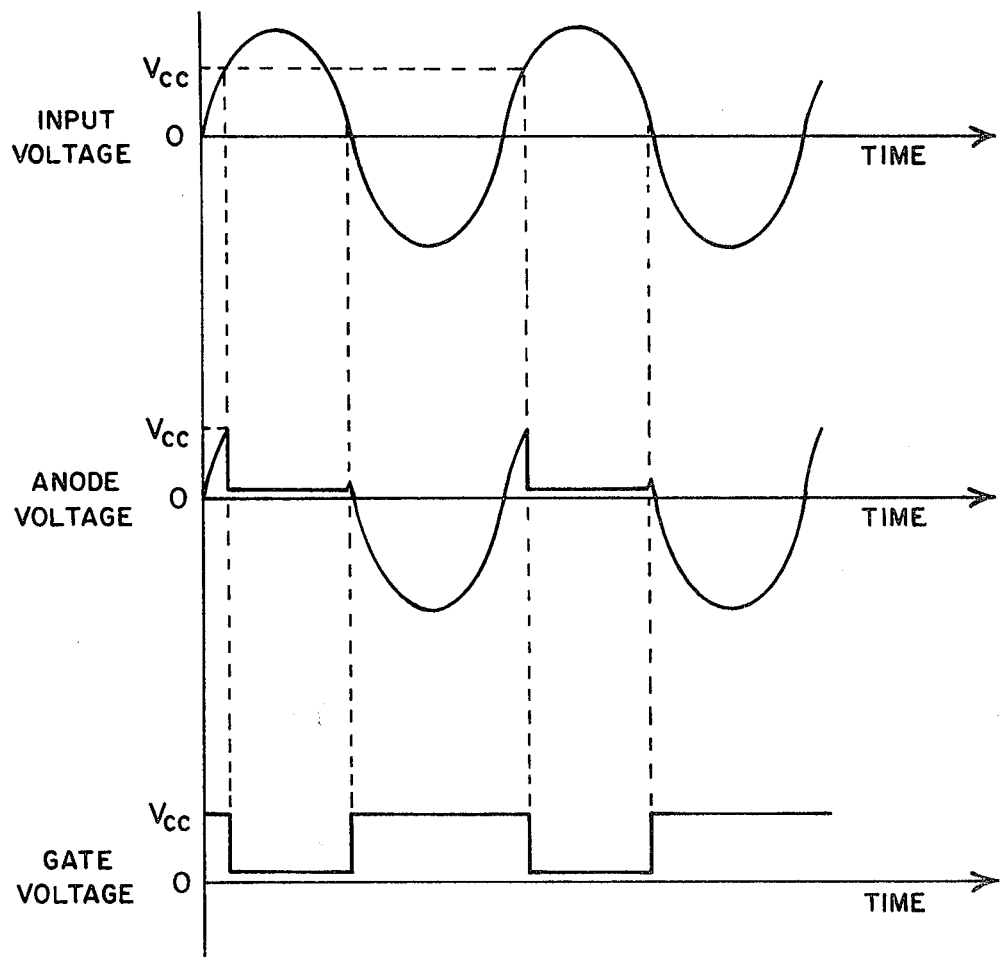
FIG. 2 shows the sinusoidal input voltage, the anode voltage, and the gate voltage of the circuit of FIG. 1 as a function of time.

The operation of the circuit of FIG. 1 is demonstrated by the voltage waveforms shown in FIG. 2. FIG. 2 shows the sinusoidal input voltage at terminal 12, the anode voltage, and the gate voltage as a function of time.

During the first part of the AC cycle, the anode voltage is below the gate voltage. The anode current and the gate current, therefore, are both very small. Since gate current is small, there is essentially no voltage drop across R2, and the gate voltage is essentially Vcc.

When the anode voltage reaches Vcc plus the threshold voltage $V_{th}$ (which is about 0.7 volts), PUT1 fires. Anode current increases until the voltage drop across R1 is sufficient to reduce the anode voltage to about 1 volt. The gate current also increases, causing a voltage drop across R2, which reduces the gate voltage to about 1 volt.

When the input voltage drops to a level which reduces the anode current to less than the holding current (or "valley current") rating of PUT1, then PUT1 switches to a non-conducting state. For typical programmable unijunction transistors, the holding current is about 50 microamperes. The input voltage corresponding to this holding current is considerably less than Vcc. There is, therefore, hysteresis and noise immunity provided in the circuit of FIG. 1.

When the input voltage drops below the voltage required to provide the holding current, PUT1 drops out of conduction, and the gate current drops to a very low value. The gate voltage, therefore, abruptly changes back to Vcc. This condition prevails for the entire negative half cycle of the AC waveform and until the anode voltage again reaches Vcc plus $V_{th}$.

In one preferred embodiment of the present invention, Vcc is 5 volts. The input AC waveform is 8 volts RMS or 12 volts peak to zero with a frequency of 60 Hz. R1 is 4.7K, which limits the maximum current to the anode of PUT1 to a safe level. Capacitor C1 is selected to have a time constant in conjunction with R1 of about 500 microseconds. This provides filtering of momentary spikes on the AC waveform without causing the significant 60 Hz phase shift.

In this preferred embodiment, in which Vcc is 5 volts, the output waveform at the gate of PUT1 has the proper levels to directly drive CMOS logic circuits. Buffer means 10, therefore, is omitted when the logic circuits driven by the sine-to-square wave converter circuit are CMOS devices. In the case of TTL logic circuits, however, the one volt minimum gate voltage is above the 0 threshold of TTL logic circuits. Buffer means 10, therefore, is required and is preferably a CMOS device such as a CMOS inverter.

In the preferred embodiment, the input voltage which corresponds to a holding current of about 50 microamps is about one volt. In the preferred embodiment, therefore, a hysteresis or noise immunity of about 4 volts is provided.

The sine-to-square wave converter circuit of the present invention has the following advantages: simplicity, low cost, noise immunity, and relative insensitivity to voltage fluctuations or spikes on the input AC waveform. Advantages of the present invention over the usually employed technique of applying an AC waveform to a CMOS inverter are: (1) more hysteresis, and therefore, greater noise immunity, and (2) relative insensitivity to voltage fluctuations. A momentary spike of several hundred volts on the AC waveform will at worst "fire" PUT1 prematurely. In the prior art circuits using a CMOS inverter, a momentary spike of several hundred volts will destroy the CMOS inverter unless an elaborate input protection network is provided.

Although the present invention has been described with reference to preferred embodiments, workers skilled in the art will recognize that changes may be made in form and detail without departing from the spirit and scope of the present invention. For example, although a programmable unijunction transistor has been specifically described, it will be recognized that other switching devices having the same properties as a programmable unijunction transistor may be used. The two-transistor analog of the PUT may, for example, be used and for the purposes of this application is included in the term "programmable unijunction transistor means".

The embodiments of the invention in which an exclusive property or right is claimed are defined as follows:

1. A circuit for producing a square wave output signal, the circuit comprising:
   first terminal means adapted to receive an alternating current signal;
   second terminal means adapted to receive a reference signal;
   programmable unijunction transistor means having gate, anode, and cathode electrodes;
   first impedance means connected to the anode and to the first terminal means for limiting current flow to the anode;
   second impedance means connected to the gate and to the second terminal means;
   capacitor means connected between the anode and the cathode; and
   means for deriving an output signal from the gate.

2. The circuit of claim 1 wherein the first impedance means and the capacitor means comprise filtering means for filtering the alternating current signal.

3. The circuit of claim 2 wherein the first impedance means comprise a resistor.

4. The circuit of claim 3 wherein the resistor and the capacitor means have a time constant which provides filtering of the alternating current signal without causing significant phase shift of the alternating current signal.

5. The circuit of claim 1 wherein the means for deriving an output signal comprises buffer means.

6. The circuit of claim 5 wherein the buffer means comprise a CMOS inverter.

7. A circuit for producing a square wave output signal, the circuit comprising:
   first terminal means adapted to receive an alternating current signal;
   second terminal means adapted to receive a reference signal;
   programmable unijunction transistor means having gate, anode, and cathode electrodes;
   current limiting means connected to the anode and to the first terminal means for limiting current flow to the anode;
   filtering means connected to the anode for filtering the alternating current signal;
   impedance means connected to the gate and to the second terminal means; and
   means for deriving an output signal from the gate.

8. The circuit of claim 7 wherein the means for deriving an output signal comprises buffer means.

9. The circuit of claim 7 wherein the filtering means comprise an RC circuit.

10. The circuit of claim 9 wherein the capacitor of the RC circuit is connected between the anode and the cathode and wherein the resistor of the RC circuit is connected between the first terminal and the anode to form the current limiting means.

* * * * *